United States Patent [19]
Finger

[11] 3,992,667
[45] Nov. 16, 1976

[54] ELECTRO-THERMAL READOUT COULOMETER

[75] Inventor: Eugene P. Finger, Brewster, N.Y.

[73] Assignee: Curtis Instruments, Inc., Mount Kisco, N.Y.

[22] Filed: Jan. 3, 1975

[21] Appl. No.: 538,464

[52] U.S. Cl. .......................... 324/94; 73/362 AR; 324/DIG. 1; 340/227 D; 340/233
[51] Int. Cl.² ........................................ G01R 27/22
[58] Field of Search .................. 324/94, DIG. 1; 340/227 D, 233; 73/362 AR

[56] References Cited
UNITED STATES PATENTS

| | | |
|---|---|---|
| 3,533,026 | 10/1970 | Klock .................................. 324/94 X |
| 3,602,813 | 8/1971 | Benseman ............................. 324/94 |
| 3,612,535 | 10/1971 | Davis et al. ................. 73/362 AR X |
| 3,686,566 | 8/1972 | Beusman ............................... 324/94 |
| 3,732,443 | 5/1973 | Lovrenich ........................ 324/DIG. 1 |
| 3,737,886 | 6/1973 | Dinges ............................. 340/233 X |
| 3,818,758 | 6/1974 | Easter ............................. 324/DIG. 1 |

*Primary Examiner*—Stanley T. Krawczewicz
*Attorney, Agent, or Firm*—Pennie & Edmonds

[57] ABSTRACT

A method and apparatus are disclosed for reading a coulometer by sensing the temperature of the electrolyte. A preferred embodiment comprises a pair of temperature sensitive elements spaced apart along the coulometer and connected to a bridge circuit.

14 Claims, 1 Drawing Figure

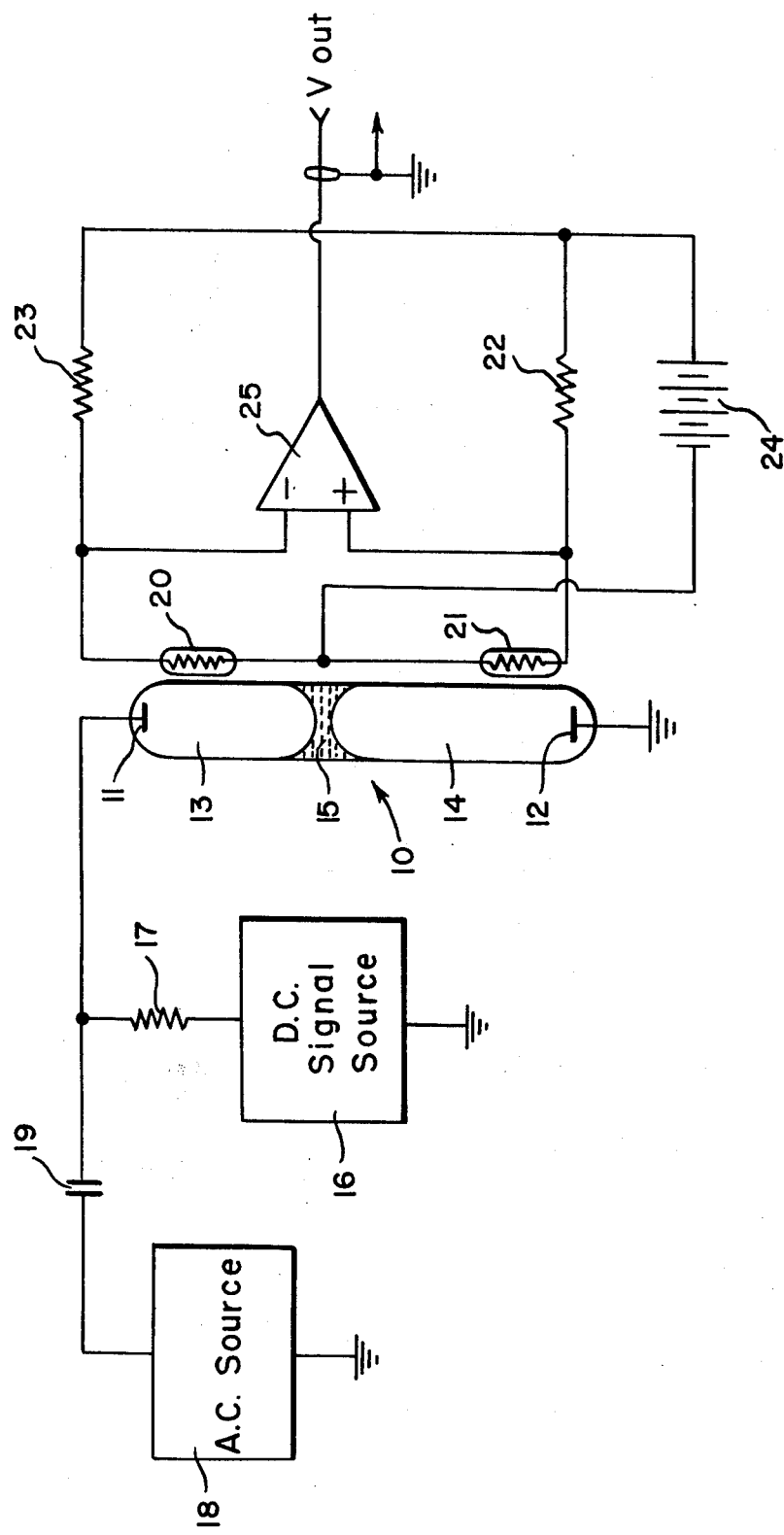

ELECTRO-THERMAL READOUT COULOMETER

BACKGROUND OF THE INVENTION

The present invention relates to electrochemical devices known as coulometers and more specifically to a coulometer-type instrument which is capable of measuring and indicating the total electrical current that has been conducted through an electrical circuit.

Coulometers are described in detail in Lester Corrsin's U.S. Pat. No. Re 27,556 entitled "Operating Time Indicator" and Curtis Beusman's U.S. Pat. No. 3,193,763 entitled "Electrolytic Coulometric Current Integrating Device", both of which are incorporated herein by reference.

The device described in these patents includes a tubular body of nonconductive material having a bore therethrough that supports two columns of a liquid metal such as mercury. The adjacent innermost ends of these columns are separated by a small volume of electrolyte with which they make conductive contact. The outermost ends of the liquid metal columns contact conductive leads that connect the instrument to the source of electric current that is to be measured. In accordance with Faraday's Law, when current flows through the instrument, liquid metal is electroplated from the anode column to the cathode column causing the anode to decrease in length and the cathode to increase an equal amount, the change in column length being directly proportional to the total electric charge passed through the instrument. Of course, this change in column length also represents a change in the position of the electrolyte along the length of the coulometer.

Readout of the total current through the instrument may be made by comparing the length of a column against a calibrated scale. Typical visual readout devices are described in the above-identified Corrsin patent and in Beusman's U.S. Pat. No. 3,343,083 entitled "Nonself-Destructive Reversible Electrochemical Coulometer". It has also been found that the coulometer may be read out electrically by measuring changes in the capacitance between the mercury columns and an electrode surrounding the tubular body. The details of such a readout device are set forth in Edward Marwell and Curtis Beusman's U.S. Pat. No. 3,255,413 entitled "ElectroChemical Coulometer Including Differential Capacitor Measuring Elements" and Eugene Finger's U.S. Pat. Nos. 3,704,431 and 3,704,432 entitled "Coulometer Controlled Variable Frequency Generator" and "Capacitive Coulometer Improvements", respectively, all of which are incorporated herein by reference.

SUMMARY OF THE INVENTION

The present invention is a method and apparatus for reading a coulometer by sensing the temperature of the electrolyte.

I have found that when electricity is passed through a coulometer, the electrolyte dissipates most of the electrical energy and therefore rises in temperature relative to the mercury columns. Thus, the position of the electrolyte and hence the integral stored in the coulometer may be read by placing one or a number of heat-sensitive devices along the length of the coulometer. In the preferred embodiment, a pair of thermosensitive devices are placed in thermal contact with the surface of a coulometer tube and spaced apart from each other.

These thermosensitive devices have a resistance which varies as a function of temperature. The thermoresistive devices are coupled to a circuit, such as a conventional Wheatstone bridge, which detects the difference between their resistances when they are at different temperatures. Thus, if the electrolyte has moved to a position adjacent one of the thermoresistive devices, the output of the bridge will change with a given polarity. Similarly, if the electrolyte has moved to a position adjacent the other thermoresistive device, the output of the bridge will change with opposite polarity. This change in the output of the bridge may be detected using any conventional circuit, such as a differential amplifier.

In some cases, where the temperature difference between the electrolyte and the mercury columns is not large enough to be easily detected, it has been found desirable to pass an AC signal through the coulometer. This signal, while it does cause the electrolyte to dissipate additional power and thus rise to an even higher temperature, has no effect on the overall integration process, since it has no DC component.

BRIEF DESCRIPTION OF THE DRAWING

The FIGURE is a schematic diagram of a coulometer system constructed in accordance with the present invention.

DETAILED DESCRIPTION OF THE PREFERRED EMBODIMENT

Referring to the figure, there is illustrated a coulometer 10 which includes electrodes 11 and 12 at opposite ends of the coulometer body. Columns of mercury 13 and 14 are in contact with electrodes 11 and 12 respectively. A quantity of electrolyte 15 is disposed in the gap between the two columns of mercury. A DC signal source 16 supplies a current proportional to the quantity to be integrated. If desired, a metering resistor 17 may be included in series with signal source 16 in order to limit the DC current passing through the coulometer and thus make the period of integration larger. Alternatively, a resistor could be put in parallel with source 16, or any other well known metering technique could be used.

As signal source 16 passes electricity through coulometer 10, mercury is plated from the anode electrode of the coulometer to its cathode electrode. This causes the electrolyte 15 between mercury columns 13 and 14 to move from one electrode to the other in a direction dependent upon the polarity of signal source 16. In a given circuit, one may even be able to vary the polarity of signal source 16 and thus vary the direction of integration.

An AC source 18 is coupled via capacitor 19 to coulometer 10. AC source 18 produces an AC current which passes through the coulometer causing the electrolyte 15 to dissipate additional energy and rise in temperature. As discussed above, if enough current is produced by DC signal source 16, it is unnecessary to add a separate AC source in order to raise the temperature of electrolyte 15. However, in many applications, integration may proceed very slowly and the amount of current passing through the coulometer without the addition of the AC source is relatively small and produces a heat change in the electrolyte which is relatively difficult to detect. In these situations, it is therefore often advantageous to use an AC source, such as source 18, to raise the temperature of the electrolyte without affecting integration.

A pair of thermoresistive devices, such as thermistors 20–21, are placed in thermal contact with coulometer 10. These two thermistors are wired into a Wheatstone bridge along with fixed resistors 22 and 23, as illustrated in the figure. The bridge is provided with power by a battery 24. The output of the bridge is coupled to a differential amplifier 25. When the electrolyte moves to a position adjacent thermistor 20 or 21, the thermistor adjacent the electrolyte will heat up and change its resistance. This causes an unbalance in the bridge and a resultant voltage change at the input terminals of differential amplifier 25. The polarity of this voltage change depends upon whether the electrolyte 15 is in contact with thermistor 20 or thermistor 21. The output of differential amplifier 25 will vary dependent upon the polarity of the signal at its input terminals.

Naturally, the response of amplifier 25 will depend on a number of system characteristics. These characteristics include the width of the gap filled by electrolyte 15, the dimensions of the thermistor, the thermal conductivity and dimensions of the tubular body of the coulometer, and the thermal nature of the systems' immediate environment. The transition region can be minimized for digital functions such as time delay switches, cycle timers and precise end-of-integral determination by making the distance between the thermistors large in comparison with the gap and the dimensions of the thermistors. Conversely, the transition region can be expanded for analog uses such as integration and proportional control analog memory by making the distance between the thermistors small in comparison with the gap and the dimensions of the thermistors. The shape of the transition region may also be tailored through dimensional control and thermal design.

While a preferred embodiment of the invention has been described, it is understood that various changes and modifications will be obvious to those skilled in the art. For example, the thermoresistive device may be replaced by thermoelectrical devices or even conventional semiconductor devices which exhibit characteristic variations with temperature. It may even be desired to digitally read out a plurality of quantized integrals by positioning a plurality of small thermosensitive devices along the length of the coulometer. It is contemplated that these changes are within the scope of the invention as defined by the following claims.

I claim:
1. An integrating circuit for integrating a current, comprising:
a. a coulometer which includes:
  i. a tubular non-conducting body defining a bore;
  ii. a first electrode at one end of said tubular body;
  iii. a second electrode at the other end of said tubular body;
  iv. a first column of mercury disposed in said tubular body and in contact with said first electrode;
  v. a second column of mercury disposed in said tubular body and in contact with said second electrode; and
  vi. a quantity of electrolyte disposed between said first column of metal and said second column of metal, said electrolyte defining a region of relatively high resistance which moves along the length of the coulometer when the coulometer is subjected to a DC current;
b. a first thermosensitive device adjacent said coulometer at a first point on said coulometer;
c. a second thermosensitive device adjacent said coulometer at a second point on said coulometer; and
d. circuit means coupled to said first and second thermosensitve devices for providing a signal when the temperature sensed by said first thermosensitive device is different from the temperature sensed by said second thermosensitve device.

2. An integrating circuit as in claim 1, further comprising means for passing an AC signal through said coulometer and raising the temperature of said region of relatively high resistance without affecting integration of the current.

3. An integrating circuit as in claim 1, wherein said first and second thermosensitive devices are thermoresistive and said circuit means includes a pair of resistors which together with said first and second thermoresistive devices comprise a Wheatstone bridge.

4. An integrating circuit as in claim 1, wherein said first and second thermosensitive devices are placed spaced apart from each other and in thermal contact with said tubular non-conducting body.

5. An integrating circuit as in claim 1, wherein the distance between the thermosensitive devices is large in comparison with the dimensions of the region of relatively high resistance.

6. An integrating circuit as in claim 1, wherein the distance between the thermosensitive devices is small in comparison with the dimensions of the region of relatively high resistance.

7. An integrating circuit for integrating a current, comprising:
a. a coulometer which includes:
  i. a hollow non-conducting body defining a bore;
  ii. a first electrode at one end of said hollow body;
  iii. a second electrode at the other end of said hollow body;
  iv. a first column of a metal disposed in said hollow body and in contact with said first electrode;
  v. a second column of a metal disposed in said hollow body and in contact with said second electrode; and
  vi. a quantity of electrolyte disposed between said first column of metal and said second column of metal;
b. at least one thermosensitive device adjacent to said coulometer at a point on said hollow body; and
c. circuit means coupled to said thermosensitive device for providing a signal in response to the temperature of the electrolyte whenever the electrolyte is in a region adjacent to said thermosensitive device.

8. A method for reading an integrator which integrates a current using a coulometer which includes a region of relatively high resistance, said region moving along the length of the coulometer when the coulometer is subjected to a DC current, said method comprising the steps of:
a. monitoring the output of a first thermosensitive device positioned adjacent said coulometer at a first point on said coulometer;
b. monitoring the output of a second thermosensitive device positioned adjacent said coulometer at a second point on said coulometer; and
c. detecting when the temperature sensed by said first thermosensitive device is different from the temperature sensed by said second thermosensitive device.

9. A method as in claim 8, further comprising the step of:
d. passing an AC signal through said coulometer and raising the temperature of said region of relatively high resistance without affecting integration of the current.

10. A method as in claim 9, wherein said first and second thermosensitive devices vary in resistance with changes in temperature and said detection is performed by comparing the resistance of said thermosensitive devices with the resistance of a pair of fixed resistors.

11. A method for reading the integral stored in an integrating circuit which integrates current using a coulometer which includes:
a. a hollow non-conducting body defining a bore;
b. a first electrode at one end of said hollow body;
c. a second electrode at the other end of said hollow body;
d. a first column of a metal disposed in said hollow body and in contact with said first electrode;
e. a second column of a metal disposed in said hollow body and in contact with said second electrode; and
f. a quantity of electrolyte disposed between said first column of metal and said second column of metal;

said method comprising the step of:
a. detecting the proximity of said electrolyte to a point on the coulometer by sensing changes produced in a thermosensitive device adjacent to said coulometer at said point on said hollow body, said changes being produced in response to the temperature of the coulometer body at said point adjacent said thermosensitive device.

12. A method for reading an integrator which integrates a current using a coulometer which includes a region having a first resistance disposed between two depositions of material having a different resistance, said region moving along the length of the coulometer as material is deposited from one of said depositions to the other of said depositions when the coulometer is subjected to a DC current, comprising the step of:
a. detecting the presence of said region adjacent a point on said coulometer by monitoring the temperature of said point and detecting a change in said temperature.

13. A method as in claim 12 wherein said region is an electrolyte whose resistance is higher than the resistance of said two depositions of material.

14. Integrating circuit as in claim 8 wherein said metal in each of said columns is mercury.

* * * * *